United States Patent
Lark, Jr.

(10) Patent No.: US 9,955,555 B2
(45) Date of Patent: Apr. 24, 2018

(54) INTELLIGENT LIGHTING CONTROL MULTI-SWITCH APPARATUSES, SYSTEMS, AND METHODS

(71) Applicant: Locoroll, Inc., Cupertino, CA (US)

(72) Inventor: William Lark, Jr., Glendale, CA (US)

(73) Assignee: Noon Home, Inc., Cupertino, CA (US)

( * ) Notice: Subject to any disclaimer, the term of this patent is extended or adjusted under 35 U.S.C. 154(b) by 0 days.

(21) Appl. No.: 15/485,050

(22) Filed: Apr. 11, 2017

(65) Prior Publication Data

US 2017/0295625 A1   Oct. 12, 2017

Related U.S. Application Data

(60) Provisional application No. 62/321,125, filed on Apr. 11, 2016.

(51) Int. Cl.
*H05B 37/02* (2006.01)
*H01H 23/14* (2006.01)
*G01R 19/165* (2006.01)

(52) U.S. Cl.
CPC ....... *H05B 37/0227* (2013.01); *G01R 19/165* (2013.01); *H01H 23/143* (2013.01); *H05B 37/0245* (2013.01); *H01H 2231/052* (2013.01)

(58) Field of Classification Search
CPC ............ H05B 37/0227; H05B 37/0245; H01H 23/143; H01H 2231/052; G01R 19/165
USPC .... 315/151, 209 R, 210, 224–226, 291, 294, 315/307, 308
See application file for complete search history.

(56) References Cited

U.S. PATENT DOCUMENTS

| | | | |
|---|---|---|---|
| 7,687,940 B2 | 3/2010 | Mosebrook | |
| 7,791,282 B2 | 9/2010 | Yu et al. | |
| 8,067,906 B2 | 11/2011 | Null | |
| 8,339,054 B2 | 12/2012 | Yu et al. | |
| 8,872,438 B2 * | 10/2014 | Zhou | H05B 33/0845 315/193 |
| 9,139,373 B2 | 9/2015 | Kanno et al. | |
| 9,184,590 B2 | 11/2015 | Testani | |
| 9,419,435 B2 | 8/2016 | Testani | |
| 9,544,975 B2 | 1/2017 | Giltaca et al. | |
| 9,608,418 B1 * | 3/2017 | Elberbaum | H02G 3/14 |
| 9,681,513 B2 | 6/2017 | Dadashnialehi et al. | |
| 9,699,863 B2 | 7/2017 | Weightman et al. | |
| 2016/0126031 A1 | 5/2016 | Wootton et al. | |

* cited by examiner

*Primary Examiner* — Jimmy Vu
(74) *Attorney, Agent, or Firm* — Fish & Richardson P.C.

(57) ABSTRACT

The present disclosure provides lighting control system multi-switch apparatuses and methods. The apparatus includes a lighting control module including at least three electrical terminals. The lighting control module configured to cause a transmission of a quantity of electrical energy to a lighting circuit of a light fixture electrically connected to the lighting control module. The apparatus includes a detector circuit positioned in the lighting control module. The apparatus includes a controller in electrical communication with the detector circuit, the controller specially programmed to cause a call signal to be transmitted to a switch connected to the traveler terminal, the call signal configured to request the switch connected to the traveler terminal transmit a response signal to the controller to identify the switch connected to the traveler terminal.

11 Claims, 16 Drawing Sheets

INTELLIGENT LIGHTING CONTROL MULTI-SWITCH APPARATUSES, SYSTEMS, AND METHODS

RELATED APPLICATION

The present application claims priority to U.S. Provisional Patent Application No. 62/321,125, filed on Apr. 11, 2016, entitled "INTELLIGENT LIGHTING CONTROL MULTI-SWITCH APPARATUSES, SYSTEMS, AND METHODS," which application is incorporated herein by reference in its entirety.

TECHNICAL FIELD

The present application relates generally to the field of lighting control systems.

BACKGROUND

Customizing and automating home lighting control devices is often epitomized by the installation of unsightly lighting switches that are inundated with light switches confusingly mapped to respective fixtures. Automated home lighting control systems can also include large, complex, expensive central hubs that require expert or skilled technicians for installation and/or operation. Smart light bulbs and/or Wi-Fi enabled lightbulbs introduced into any of these contexts or even in simpler ones can disadvantageously be limited by the light switch that it is associated with and/or the lighting fixture itself. For example, if a light switch associated with a smart light bulb is switched off the smart light bulb becomes inoperable.

Similarly operation of a lighting control system with multiple switches connected to a common fixture, can cause unwanted changes in the mode of operation of one or more of the switches including precluding dimming or causing dimming at unintended levels.

SUMMARY

The inventors have appreciated that various embodiments disclosed herein permit multi-way switch operation to accommodate proper changes in lighting scenes when different switch types are implemented together.

Various embodiments provide a lighting control system multi-switch apparatus, the apparatus includes a lighting control module including at least three electrical terminals, including a power terminal, a common terminal, and a traveler terminal. The lighting control module configured to cause a transmission of a quantity of electrical energy to a lighting circuit of a light fixture electrically connected to the lighting control module. The apparatus includes a detector circuit positioned in the lighting control module. The detector circuit is electrically coupled to the traveler terminal and is configured to detect a grounding of the traveler terminal. The apparatus includes a controller in electrical communication with the detector circuit, the controller specially programmed to cause a call signal to be transmitted to a switch connected to the traveler terminal, the call signal configured to request the switch connected to the traveler terminal transmit a response signal to the controller to identify the switch connected to the traveler terminal. The controller is configured to initiate an inverse switching protocol in response to a failure of the switch connected to the traveler terminal to respond, the inverse switching protocol configured to cause the lighting control module to inverse an input received from the switch at either the common terminal or the traveler terminal.

In some embodiments, the detector circuit includes a current sensor.

In some embodiments, the current sensor is coupled to at least two of the three electrical terminals.

In some embodiments, the controller is configured to cause the call signal to be transmitted through the traveler terminal.

In some embodiments, the electrical detection signal has an electrical current of less than 1 amp.

In some embodiments, the switch connected to the traveler terminal is downstream of the lighting control module with respect to a power source connected to the lighting control module upstream of the lighting control module.

In some embodiments, the switch connected to the traveler terminal is upstream of the light control module with respect to a power source coupled to the switch upstream of the switch.

In some embodiments, the detector circuit includes an analog digital converter.

Various embodiments provide a lighting control system multi-switch apparatus. The apparatus includes a lighting control module including at least three electrical terminals, including a power terminal, a common terminal, and a traveler terminal. The lighting control module is configured to cause a transmission of a quantity of electrical energy to a lighting circuit of a light fixture electrically connected to the lighting control module. The apparatus includes a detector circuit positioned in the lighting control module. The detector circuit is electrically coupled to the traveler terminal and is configured to detect a grounding of the traveler terminal. The apparatus includes a controller in electrical communication with the detector circuit. The controller is specially programmed to initiate an inverse switching protocol in response to a detection by the detector circuit of the grounding of the traveler terminal. The inverse switching protocol is configured to cause the lighting control module to inverse an input received at either the common terminal or the traveler terminal from a switch connected to the traveler terminal.

Various embodiments provide a lighting control system apparatus. The apparatus includes at least one component configured to detect an electrical coupling of a first multi-way electrical switch to a second multi-way electrical switch.

Various embodiments provide a method of operating a lighting control system according to anyone of the apparatuses disclosed herein.

Various embodiments provide a computer program product for operating a lighting control system apparatus according to anyone of the apparatuses disclosed herein.

Various embodiments provide a computer program product for operating a lighting control system apparatus according to anyone of the apparatuses disclosed herein.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

The features and advantages of the inventive subject matter disclosed herein will become more apparent from the detailed description set forth below when taken in conjunction with the drawings.

DETAILED DESCRIPTION

Following below are more detailed descriptions of various concepts related to, and exemplary embodiments of, inventive systems, methods and components of lighting control devices.

Figure 1A:
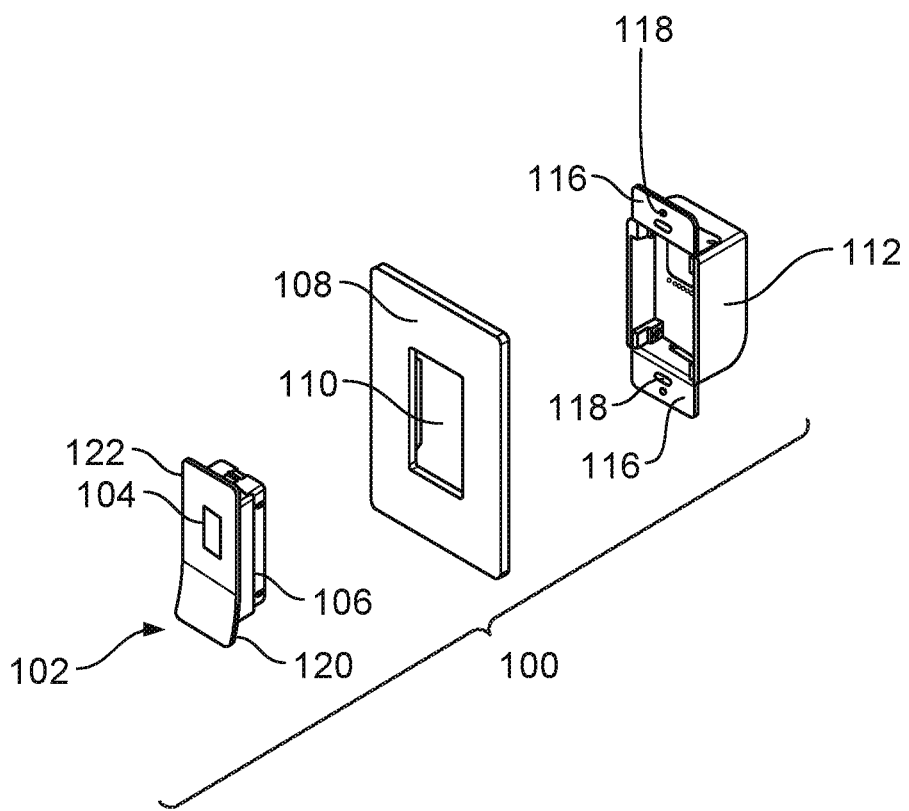
FIG. 1A is a perspective partially exploded view of a lighting control device.

FIG. 1A is a perspective partially exploded view of a lighting control device 100. The lighting control device 100 includes a switch module 102 including a light switch actuator 106 and a tactile display 104 housed in the light switch actuator 106. The lighting control device 100 also includes a wall plate cover 108 including a switch module opening 110 extending therethrough. The lighting control device 100 also includes a base module 112 configured for coupling to the switch module 102 via multi-pin socket 114. The base module 112 is sized and configured for receipt within a one-gang wall electrical box and has a volume corresponding substantially thereto. The base module 112 is configured to be coupled to a wall electrical box via connection tabs 116 and fastener apertures 118 in the connection tabs 116.

The light switch actuator 106 includes an outer actuation surface 122, which as discussed further herein may be composed of glass. The actuation surface 122 is movable, for example, by pushing on the curved foot 120 to cause the light switch actuator 106 to pivot, for example. The pivoting of the light switch actuator 106 and the actuation surface 122 causes a contact component (shown in FIG. 2) of the switch actuator 106 to move from a first position to a second position. Movement of the contact component causes a connection of an electrical flow path, for example by allowing two electrical contacts to connect or by connecting the contact component with an electrical contact. The connecting of the electrical flow path, permits electrical energy supplied by a power source connected to the base module 112 to energize or activate the tactile display 104, as discussed in further detail herein. The tactile display 104 is structured in the switch module to move contemporaneously with at least a portion of the actuation surface 122 and with the actuator 106. When activated or energized, the tactile display 104 allows a user to define or select predefined lighting settings where the lighting settings change the voltage or power supplied to one or more light fixtures. The change in power supplied to the light fixtures may include a plurality of different voltages supplied to each fixture and may be based on various parameters including, but not limited to, location, light intensity, light color, type of bulb, type of light, ambient light levels, time of day, kind of activity, room temperature, noise level, energy costs, user proximity, user identity, or various other parameters which may be specified or detected. Furthermore, the lighting control device 100 may be connected to all of the lights in a room or even in a house and can be configured to operate cooperatively with one or more other lighting control devices 100 located in a unit or room and connected to the same or distinct lighting fixtures.

Figure 1B:
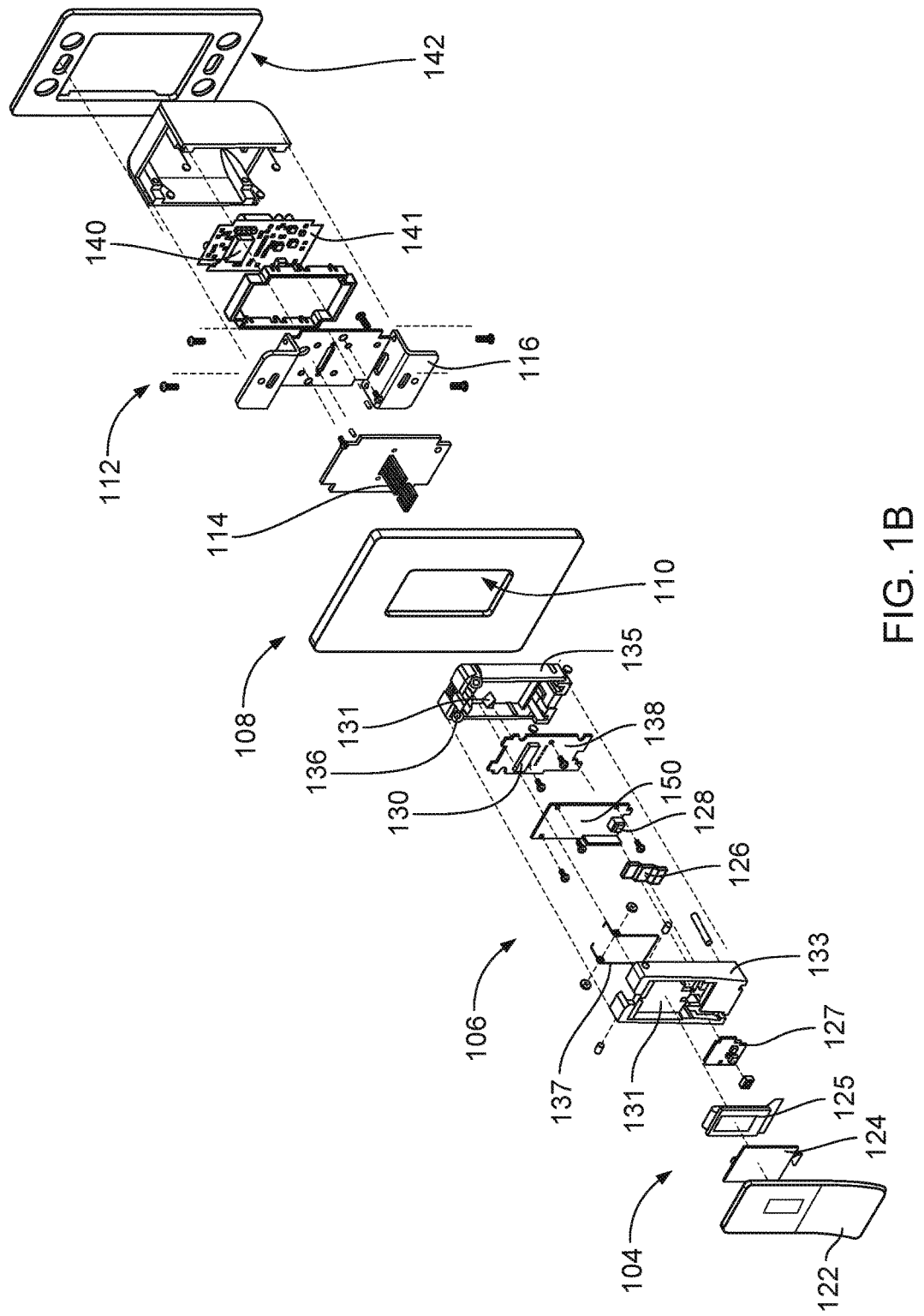
FIG. 1B is a fully exploded view of the lighting control device of FIG. 1A

FIG. 1B is a fully exploded view of the lighting control device 100 of FIG. 1A. As demonstrated in FIG. 1B, the tactile display 104 is positioned between the outer actuation surface 122 and the light switch actuator 106. The actuation surface 122 may be composed of an impact-resistant glass material permitting light from the tactile display 104 and/or a clear sight of path for sensors 127 or other lights, such as a light from light pipe 126 indicating activation to pass through the actuation surface 122. The tactile display 104 is composed of a polymer-based capacitive touch layer 124 and a light emitting diode panel 125, which are controlled via one or more modules or processors positioned on the printed circuit board 129. The tactile display 104 is housed within a recess 131 of the light switch actuator 106 beneath the actuation surface 122. The light switch actuator 106 may be formed as a thermoplastic housing including a housing cover 133 and a housing base 135. The light switch actuator housing cover 133 is pivotally connected to the housing base 135 via pins 136 and the housing cover 133 is biased with respect the housing base 135 via torsion spring 137. In particular embodiments, the light switch actuator housing cover 133 may be configured to slide or otherwise translate or rotate. The outer actuation surface 122 is biased with the switch actuator housing cover 133 and moves contemporaneously therewith in concert with the tactile display 104 housed in the cover component 133 of the light switch actuator 106. The light switch actuator 106 includes a switch pin 128 movable between positions to close an open circuit on the primary printed circuit board substrate 150, which board also houses a switch controller or processor. In certain embodiments the light switch actuator 106 may include a circuit board stack, including the primary printed circuit board substrate 150 and a secondary printed circuit board 138 The light switch actuator 106 may include a latch 136 for coupling to the base module 112 (e.g. as the light switch actuator 106 is passed through the opening 110 in the wall plate cover 108), which latch causes the light switch actuator 106 to click into place. The housing base 135 includes a multi-pin connector or plug 134 configured to engage the multi-pin socket 114 of the base module 112.

The lighting control device 100 includes a mounting chassis 142 configured to be installed to an electrical wall box. The mounting chassis 142 creates an even surface for installation of the other modules (e.g., the base module 112 and the switch module 102). Once the base module is connected to the electrical wall box via the mounting chassis 142, the wall plate cover 108 can be coupled to the mounting chassis 142 and the light switch actuator 106 can be inserted through the switch module opening 110. In particular embodiments, the wall plate cover can be coupled to the mounting chassis 142 and/or the tabs 116 of the base module via magnets. The magnets may be recessed within openings of a portion of the wall plate cover 108. As noted, the base module 112 is configured to be coupled to a wall electrical box via connection tabs 116. The base module 112 is further configured to be electrically coupled to a power source and to one or more light fixtures wired to the electrical box. Accordingly, the base module 112 provides an interface between a power source, the light switch actuator 106, and one or more light fixtures. The base module includes a processor 140 and a circuit board 141 for managing the power supplied by the power source and routed to the one or more light fixtures in accordance with a light setting selection identified via the light switch actuator 106 or the tactile display 104.

One or more of the processor on the printed circuit board 15038a or 138b 130 and the base module processor 140 may include wireless links for communication with one or more remote electronic device such as a mobile phone, a tablet, a laptop, another mobile computing devices, one or more other lighting control devices 100 or other electronic devices operating in a location. In certain implementations the wireless links permit communication with one or more devices including, but not limited to smart light bulbs, thermostats, garage door openers, door locks, remote controls, televisions, security systems, security cameras, smoke detectors, video game consoles, robotic systems, or other communication enabled sensing and/or actuation devices or appliances. The wireless links may include BLUETOOTH classes, Wi-Fi, Bluetooth-low-energy, also known as BLE (BLE and BT classic are completely different protocols that just share the branding), 802.15.4, Worldwide Interoperability for Microwave Access (WiMAX), an infrared channel or satellite band. The wireless links may also include any cellular network standards used to communicate among mobile devices, including, but not limited to, standards that qualify as 1G, 2G, 3G, or 4G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 4G standards may correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards may use various channel access methods e.g. FDMA, TDMA, CDMA, or SDMA. In some embodiments, different types of data may be transmitted via different links and standards. In other embodiments, the same types of data may be transmitted via different links and standards.

Figure 2A:
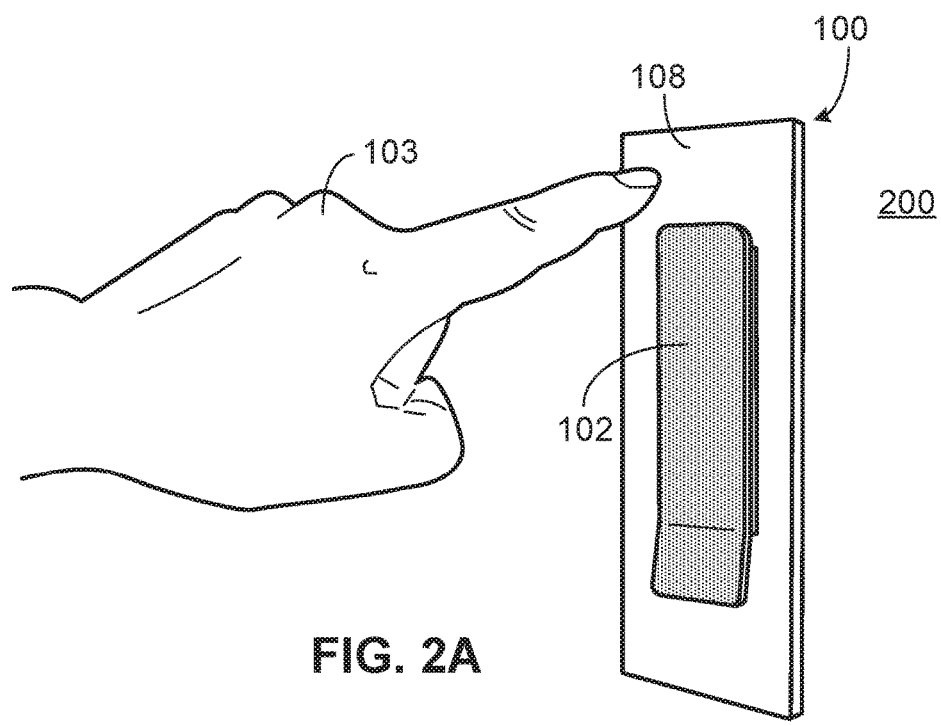
FIG. 2A shows the lighting control device of FIG. 1A mounted on a wall.

FIG. 2A shows the lighting control device 100 of FIG. 1A mounted on a wall 200. As demonstrated in FIG. 2A, the base module 112 is not visible upon installation of the lighting control device 100 in view of the wall plate cover 108. Because the wall plate cover 108 attaches to the base module 112, the wall plate cover 108 appears to be floating on the wall 200. The lighting control device 100 may be activated by a user 103 interacting with the outer actuation surface 122 and the tactile display 104.

Figure 2B:
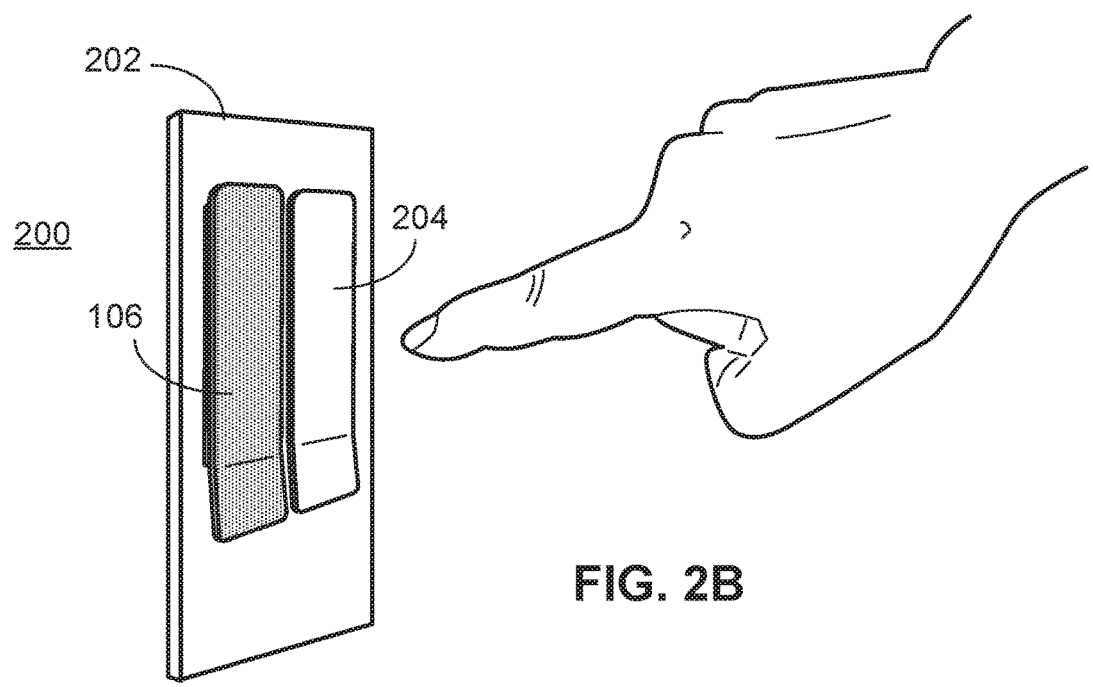
FIGS. 2B and 2C illustrate multi-switch lighting control devices.
Figure 2C:
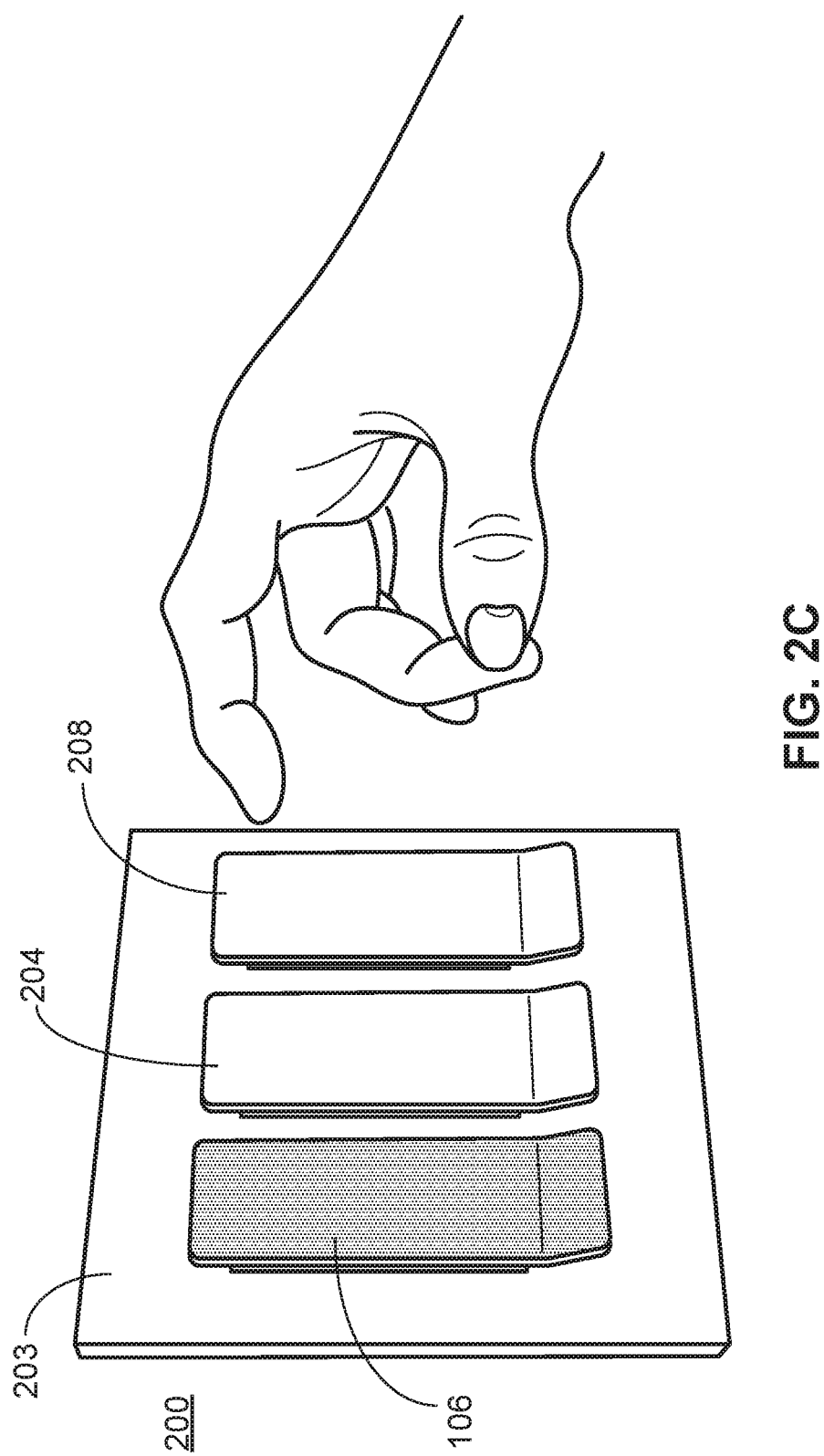

FIGS. 2B and 2C illustrate multi-switch configurations of multiple lighting control device. FIGS. 2B and 2C illustrate a two switch and three switch embodiment respectively where the lighting control devices 202 and 203 each include a light switch actuator 106 as well as auxiliary switches 204 and 208, as well as 2 and 3 base modules 112, respectively.

FIGS. 3A-3F illustrate a lighting control device transitioning through various lighting settings and a room having lighting fixtures controlled by the lighting control device.

Figure 3A:
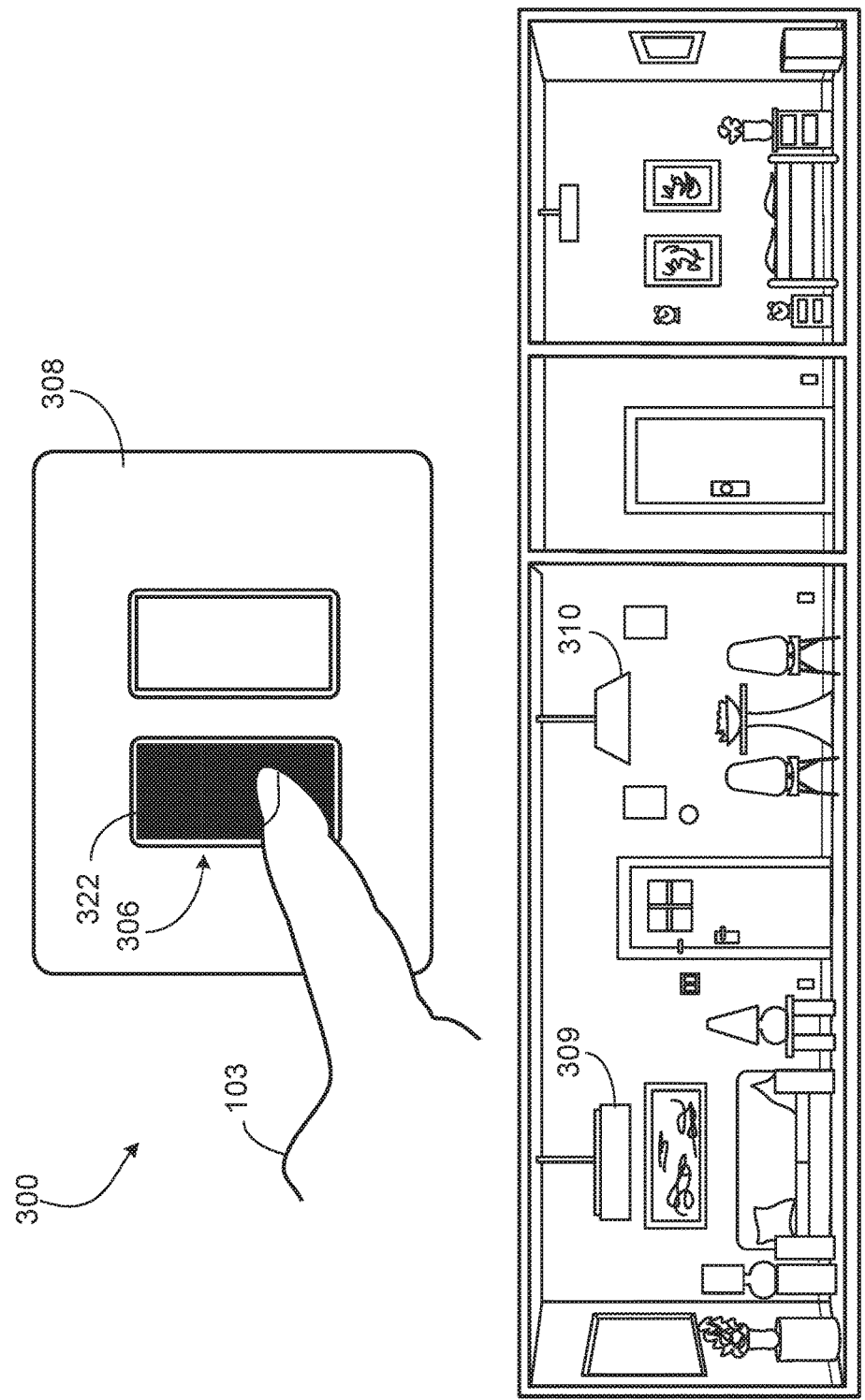
FIGS. 3A-3F illustrate a lighting control device transitioning through various lighting settings and a room having lighting fixtures controlled by the lighting control device.
Figure 3B:
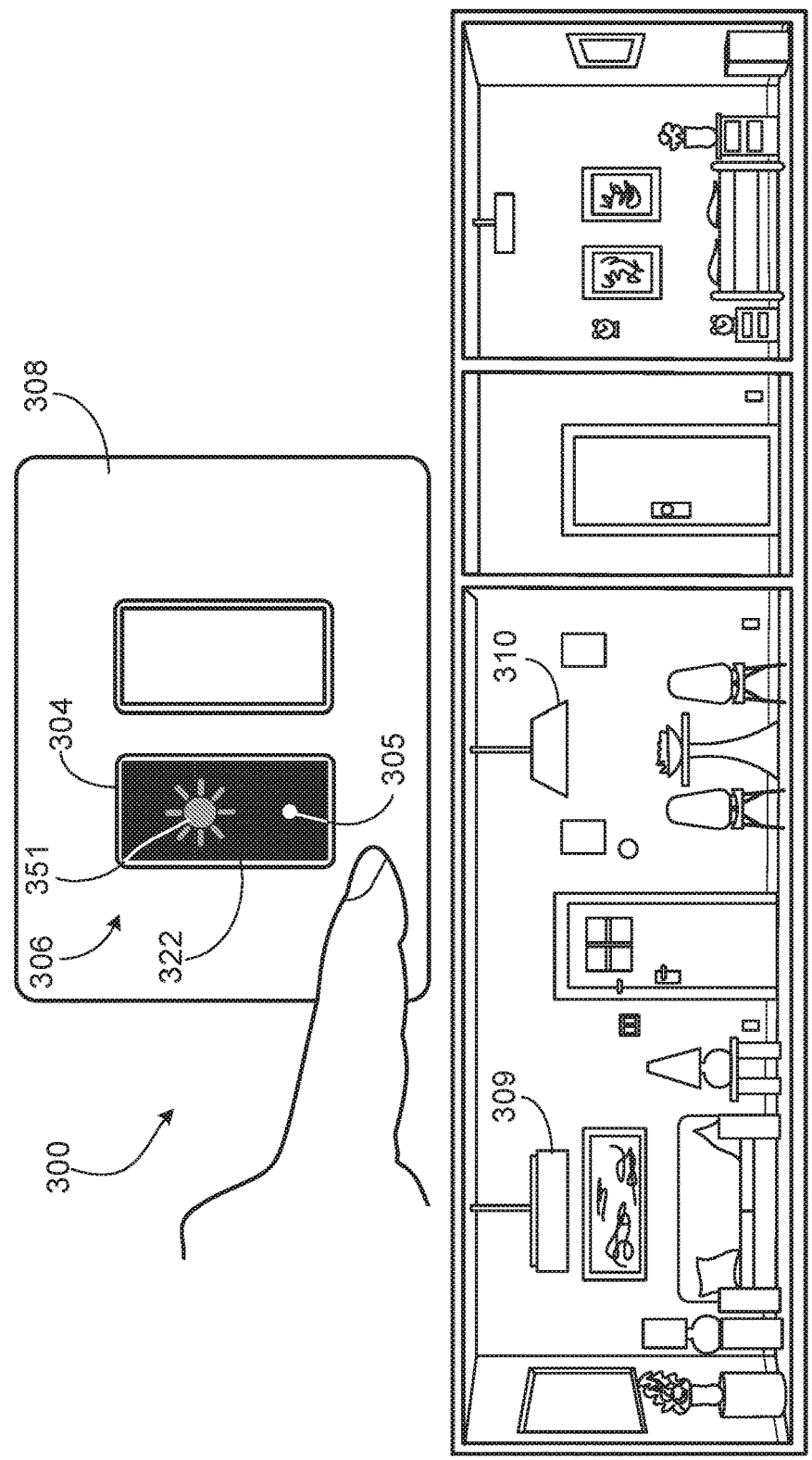
Figure 3C:
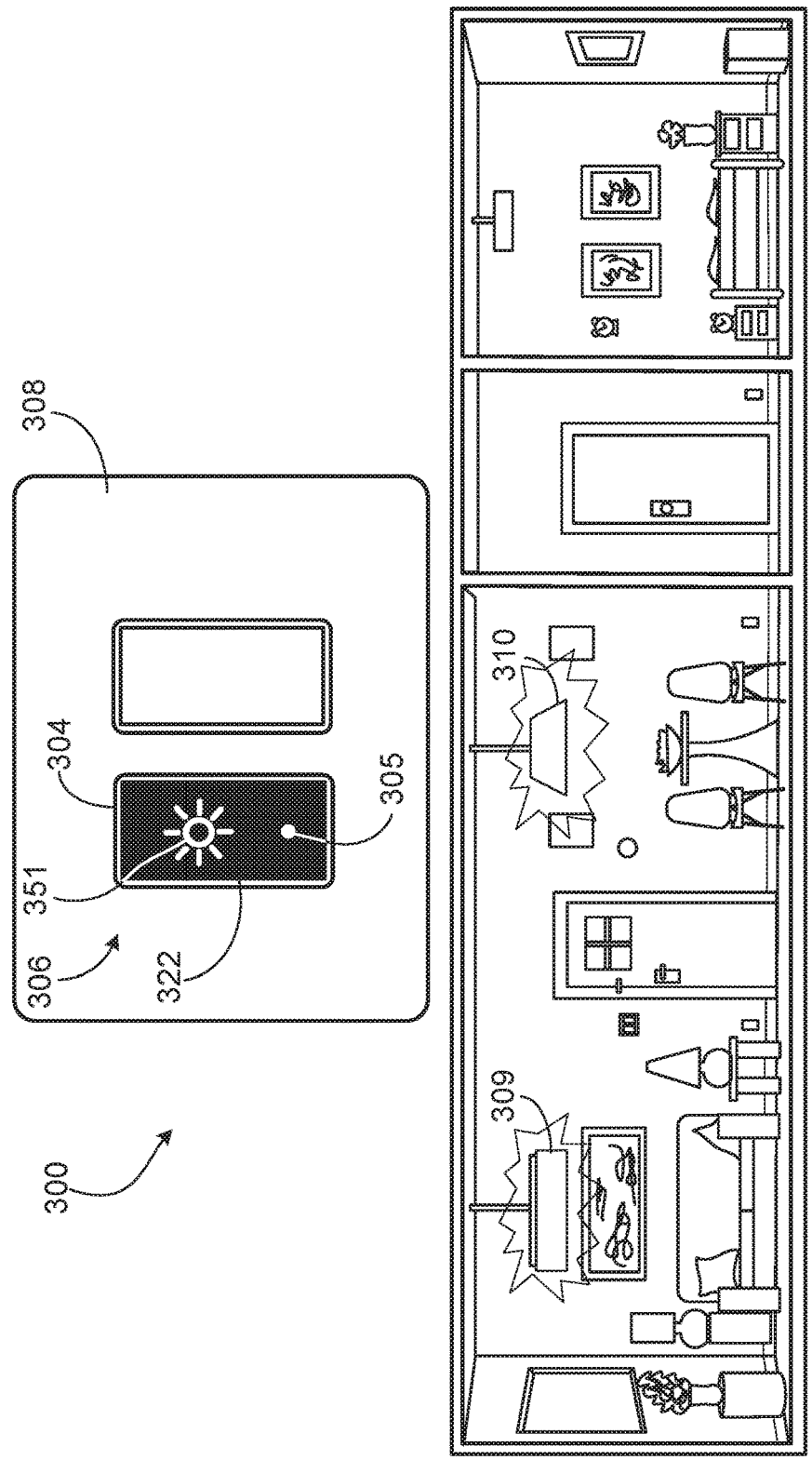
Figure 3D:
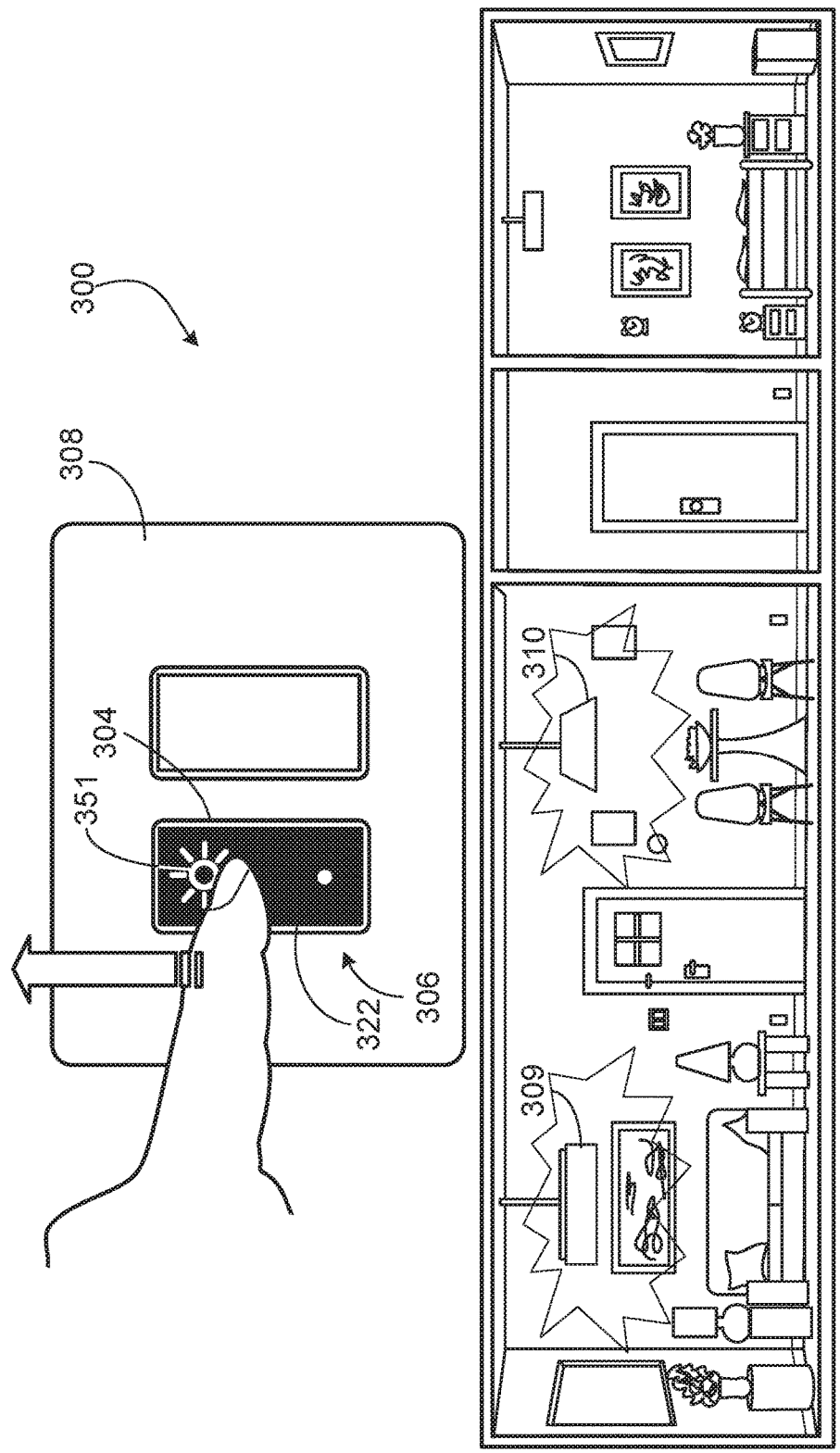
Figure 3E:
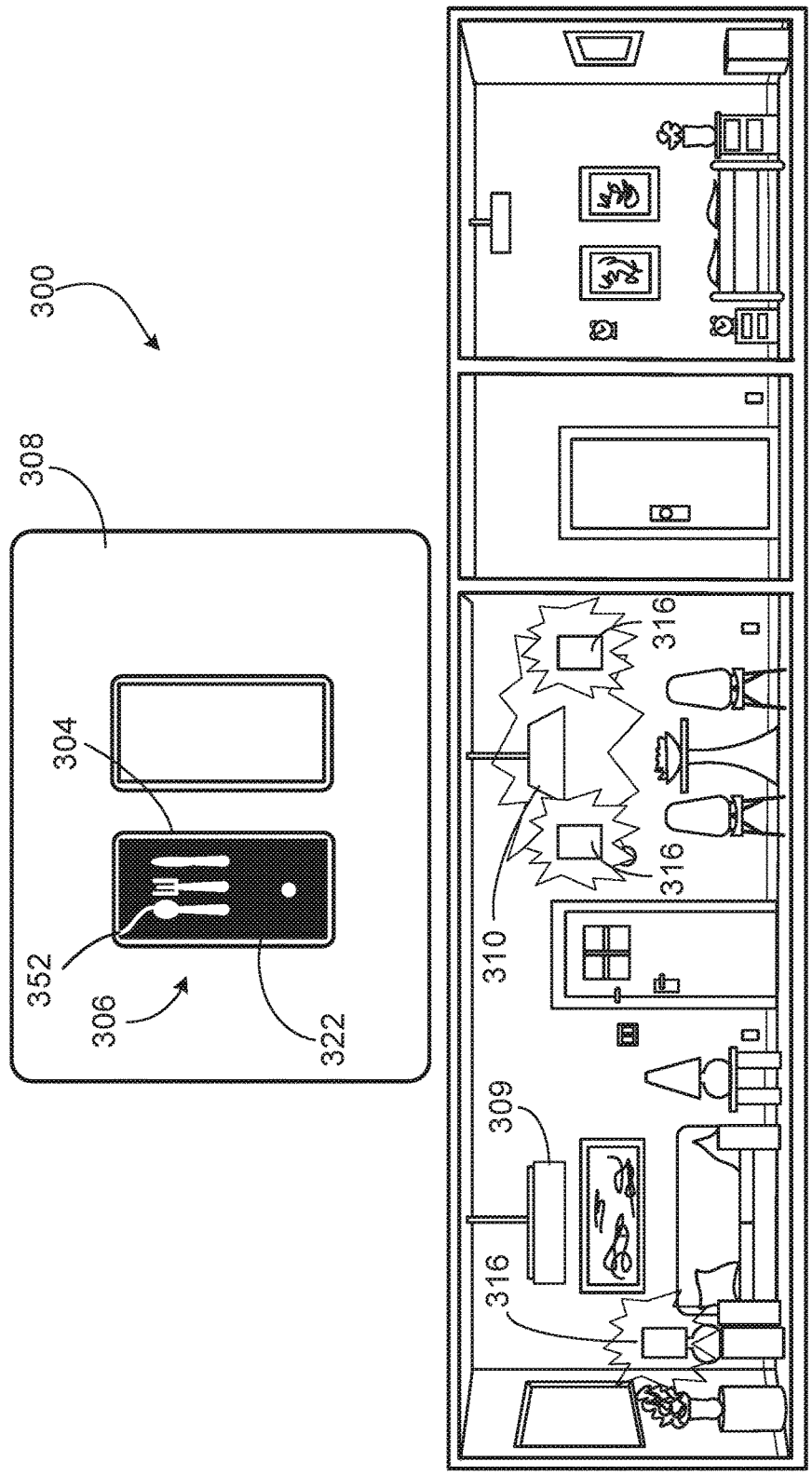
Figure 3F:
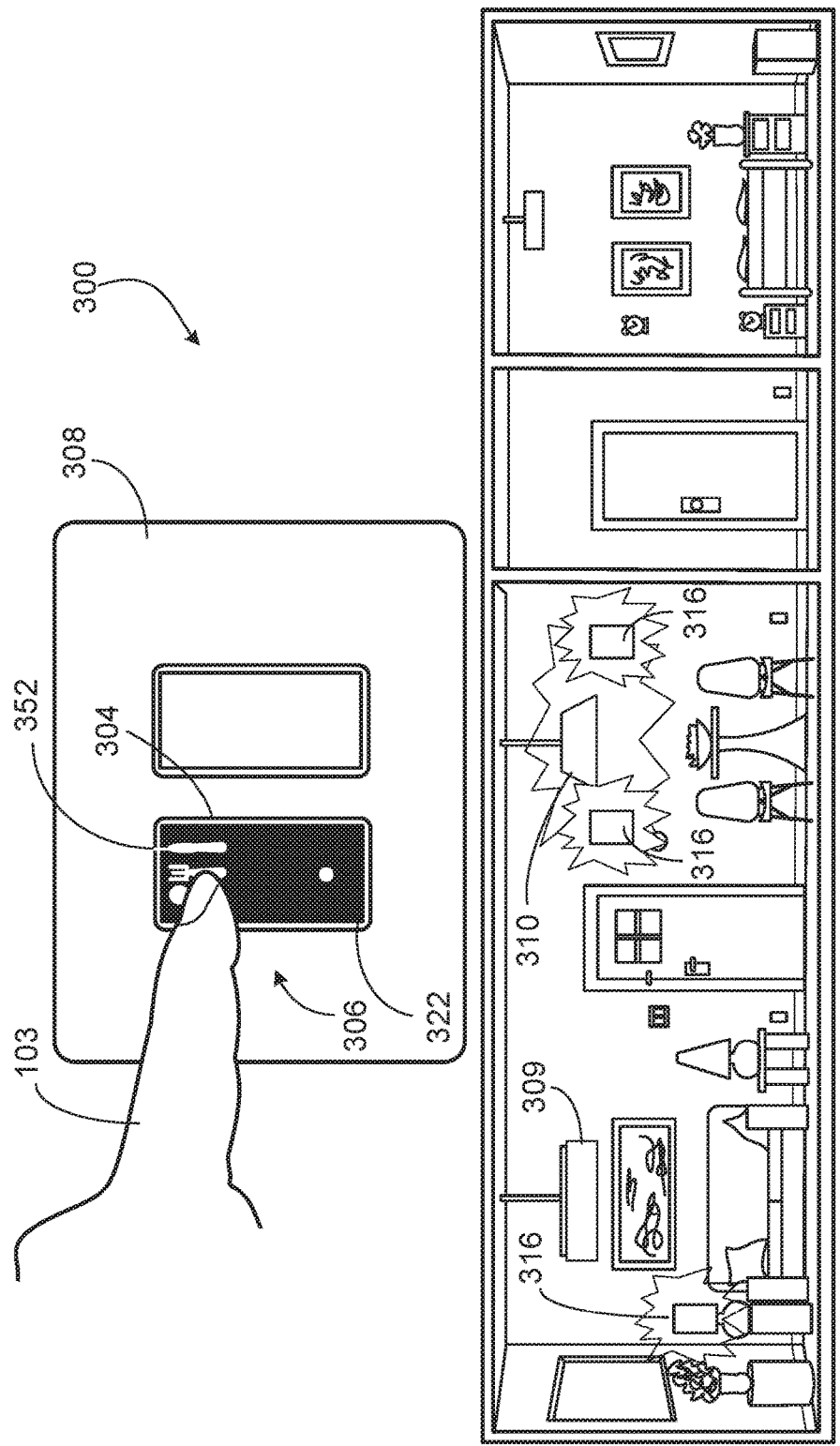

In FIG. 3A, the lighting control device 300 is connected to a base module positioned behind the wall plate 308. The lighting control device 300 includes a dynamic light switch actuator 306, operable in a manner similar to the light switch actuator discussed in connection with FIGS. 1A-2C, and an auxiliary light switch actuator. As demonstrated in FIG. 3A by the unilluminated outer actuation surface 322 of the light switch actuator 306 is inactive and not energized. In response to a user 103 moving the actuation surface 322 of the light switch actuator 306, the light switch actuator 306 begins to become energized, as shown in FIG. 3B. The energization or activation of the light switch actuator 306 is signaled by the power light indicator 305 and by full lighting setting icon 351. As shown in FIG. 3C where the icon 351 is fully lit (rather than partially lit as in FIG. 3B), the light switch actuator 306 is fully energized. In this particular configuration, the primary lights 309 and 310 are illuminated at full power. FIG. 3D shows the transition between lighting settings. As demonstrated in FIG. 3D, this transition is facilitated via user 103 completing swiping gesture 312 across the tactile display 304 and along the actuation surface 322. As the user completes the gesture 312, the icon 351 is swiped from the tactile display 304 as the tactile display toggles to a new light setting shown in FIG. 3E. The new light setting shown in FIG. 3E is represented or identified by the dinner icon 352. The new light setting shown in FIG. 3 has the light fixture 309 powered down and has caused lamp 316 and sconces 318 to become illuminated to change the lighting scene in the room. The change in the light setting causes a change in distribution of power to certain lighting fixture based on the selected lighting setting. The light switch actuator 306 may be pre-programmed with a plurality of lighting settings or may be configured with particular lighting settings as specified by the user 103. A further swiping gesture 315 shown in FIG. 3F or a different gesture are used to transition from the lighting setting of FIG. 3F represented by icon 352 to a further lighting setting.

Figure 4:
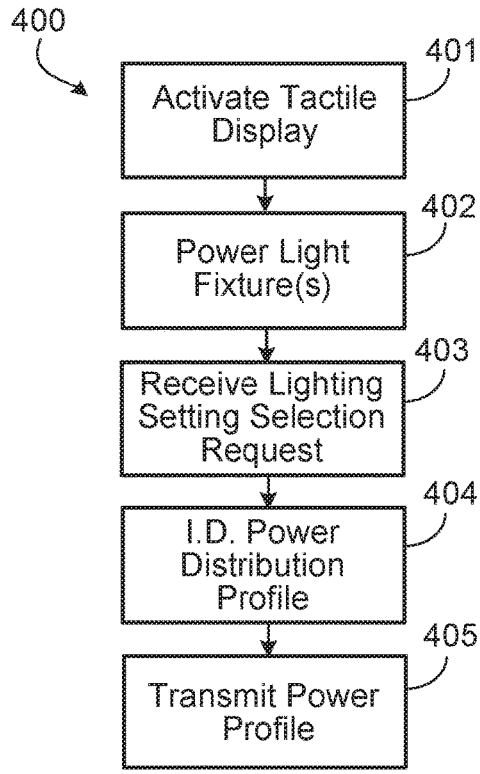
FIG. 4 provides a flow diagram of operations of a system for controlling a lighting control device.

FIG. 4 provides a flow diagram of operations of a system for controlling a lighting control device. FIG. 4 illustrates control operations of a control system, such as processor 130 configured to control the lighting control device 100 or 300, in accordance with various embodiments of the present invention. At 401, the tactile display housed in the light switch actuator is activated by moving the light switch actuator, for example by moving the actuation surface of the light switch actuator. At 402, the light fixtures electrically coupled to the light switch actuator via a base module are powered as the movement of the light switch actuator causes a contact component to move into a new position and thereby permit or cause an electrical flow path between a power source and the light fixture(s) to be closed. The tactile display housed in the light switch actuator is moved contemporaneously with the actuation surface. At 403, a lighting setting selection request is received via the tactile display, for example by a particular motion or motions on the tactile display. The lighting setting selection request identifies a lighting setting from among a plurality of lighting settings. A user may swipe multiple times to toggle through the plurality of lighting settings or may conduct a specific motion that corresponds to a particular lighting setting including, but not limited to, a half swipe and tap to achieve a light intensity of all the connected light fixtures at half of their peak output. The lighting settings identify distinct power distribution schemes for one or more light fixtures connected to the light switch module. At 404, a power distribution scheme is identified. At 405, the identified power distribution scheme is transmitted, for example by the base module responding to control signals from the light switch actuator, to adjust one, some, or all of the lights based on the power distribution scheme corresponding to the lighting setting selected. The power distribution schemes or profiles may be stored in a memory device of the lighting control device. In certain embodiments, the power distribution schemes may be adjusted to account for other parameters such as ambient lighting from natural light or an unconnected source. In certain embodiments the power distribution schemes may be adjusted based on one or more other sensor parameters. In particular embodiments, the lighting setting may be adjusted by automation based on time of day, sensed parameters such as light, temperature, noise, or activation of other devices including, but not limited to, any electronic device described herein.

Figure 5:
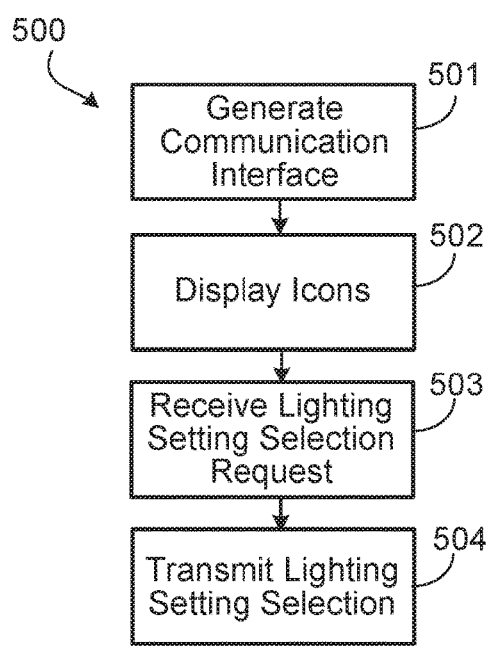
FIG. 5 shows a flow diagram of a system for remotely operating a lighting control device.

FIG. 5 shows a flow diagram of system for remotely operating a lighting control device. In particular embodiments, the lighting control device 100 or 300 may be operable from a remote device if the actuator switch is activated or energized. In such instances, the remote device may include one or more computer program applications, such as system 500, operating on the device to communicate with and control the lighting control device. Accordingly, at 501, the control system 500 initiates a connection module to generate a communication interface between a mobile electronic device and a light switch module. The connection module may cause the remote device to send one or more wireless transmission to the lighting control device via a communication protocol. At 502, the control system 500 causes the remote device to generate a display of icons on a display device of the mobile electronic device to facilitate selection of a lighting setting. At 503, the control system 500 receives a lighting setting selection based on the user selecting a particular icon. At 504, a transmission module causes the lighting setting selected to be transmitted to the lighting control device so that the light switch module and/or the base module can cause the power distribution scheme corresponding to the lighting setting to be transmitted to the lighting fixtures. The tactile display of the lighting control device may be updated in concert with receipt of the lighting setting to display the icon selected on the mobile electronic device and corresponding to the lighting setting selected on the tactile device.

Figure 6:
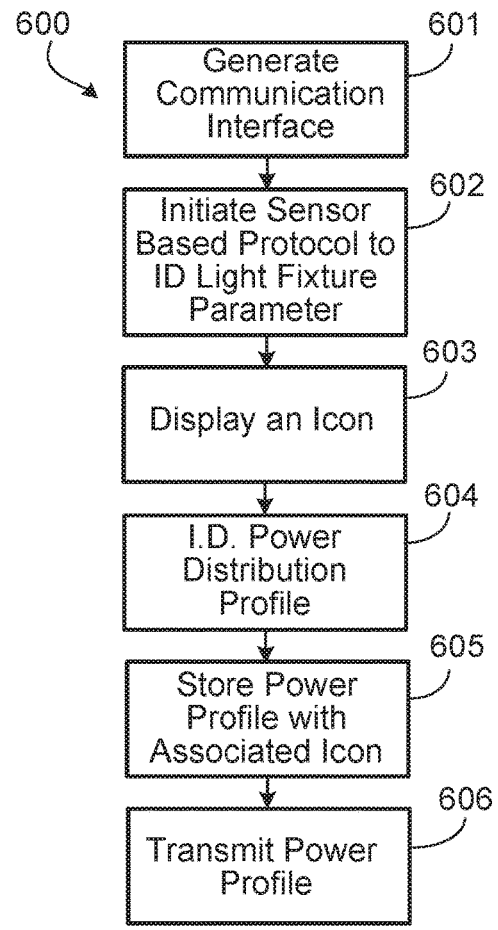
FIG. 6 illustrates a flow diagram of a system for remotely configuring operations of a lighting control device.

FIG. 6 illustrates a flow diagram of a system for remotely configuring operations of a lighting control device. The remote device may include devices including, but not limited to a mobile phone, a mobile computing device or a computing device remote from the light control device. At 601, the mobile electronic device generates a communication interface with the light switch module. At 602 a light fixture identification module initiates a sensor based protocol to identify a parameter associated with one or more light fixtures connected to the light switch control module. At 603, a display selection module causes a display of an icon to appear on a display device of the mobile electronic device. At 604, a lighting setting configuration module allows a user to create a power distribution scheme or profile for the light fixtures identified based on the identified parameters and a user specified input related to light intensity. At 604, a storage module is used to the store the power distribution scheme and associate a particular lighting setting icon with the power distribution scheme. At 605, a transmission module transmits the power distribution scheme and the associated icon to the light switch control module.

Figure 7:
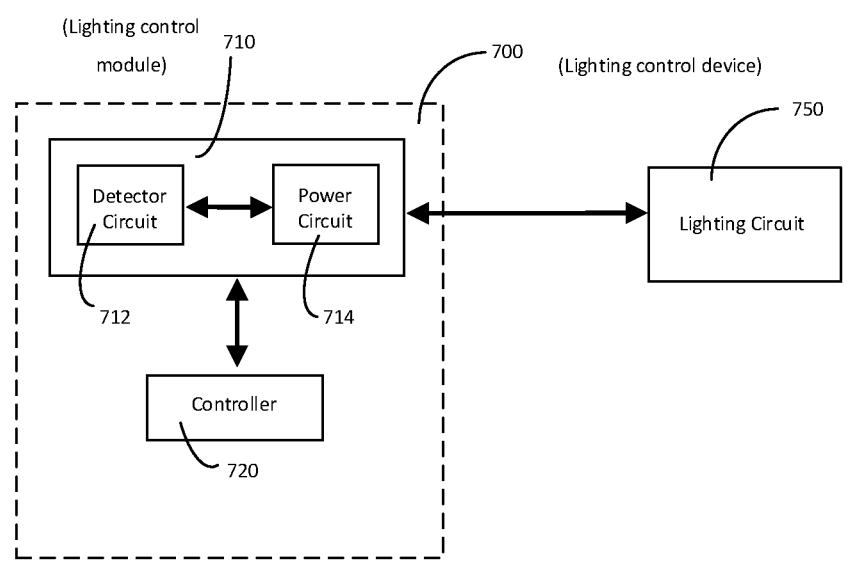
FIG. 7 is a schematic of a lighting control system apparatus.

FIG. 7 is a schematic of a lighting control system apparatus. The lighting control system apparatus includes a lighting control module 700. The lighting control module 700 can be configured like the lighting control device 100 to include a switch module removably coupled to a base module. The lighting control module 700 is configured to adjust a lighting scene by causing a change in the power distribution scheme to one or more lighting fixtures of lighting circuit 750. In connection with changing the power distribution scheme, the lighting control module 700 includes a detector circuit 712 for detecting one or more electrical parameters related to the lighting control module 700. As discussed further herein, these electrical parameters may provide information related to the configuration of the lighting control module 700 and/or the configuration of one or more components connected to the lighting control module 700. The lighting control module 700 also includes a power circuit 714 for regulating the power flow to and from the lighting control module 700. The power circuit 714 and the detector circuit 712 are communicably coupled for bidirectional communication with one or more controllers 720. In some embodiments, the controller 720 may include a controller on the switch module which may communicate with the detector circuit and the power circuit through a separate controller positioned in the base module. The power circuit 714 and 712 are positioned in a base module and are connected to the lighting circuit 750. The control of electricity from the power circuit 714 to the lighting circuit 750 is regulated (directly or indirectly) by the controller 720. The power circuit 714 may include one or more transformers or power converters and may be configured for power isolation to maintain AC current flow from interacting with various DC components. The detector circuit may include one or more components configured to measure current, voltage, impedance or other electrical properties, signals, or data.

The power circuit 714 can be configured to adjust the signal supplied (input signal), which is related to the power supplied by it, to the lighting circuit 750. For example, the power circuit 714 can comprise a tunable voltage source that can supply an input voltage signal with tunable voltage amplitude to the lighting circuit 750. The input voltage signal can be an AC and/or a DC signal whose amplitude can be tuned by the power circuit 714. In some implementations, the power circuit 714 can comprise a tunable current source that can supply an input current signal with varying current amplitude to the lighting circuit 750. For example, the input current signal can be an alternating (AC) and/or direct (DC)

whose amplitude can be varied by the power circuit 714. In some implementation, the power circuit 714 can comprise both tunable voltage source and tunable current source. The power circuit 714 may be configured to supply an input voltage and/or current signal at discrete amplitudes. The power circuit 714 may be configured to increase/decrease the quantity of power supplied to the lighting circuit 750, for example by increasing/decreasing the amplitude of the input voltage and/or current signal.

One or more properties of the input signal can be controlled by the controller 720. The controller 720 and power circuit 714 can interact electronically by wire or wirelessly. The controller 720 can send a control signal to the power circuit 714 that may determine the properties of the input signals (voltage and/or current signals). For example, the control signal may contain data that includes an array of numerical values of amplitudes (and frequencies) of sinusoidal input signals. The power circuit 714 may set the amplitude and frequency of the input signals (voltage and/or current signals) based on the control signal.

The response of the lighting circuit 750 measured by the detector circuit 712 may include one or more of current, voltage and impedance. The response of the lighting circuit 750 may be represented by an analog signal, i.e., a signal that can continuously vary with time. In some implementations, the detector circuit 712 may include a voltage sensing circuit that can detect a voltage signal (e.g., voltage across the lighting circuit 750). In some implementations the detector circuit 712 can include a current sensing circuit that can detect a current signal (e.g., the current flowing into the lighting circuit 750). In some implementations, the detector circuit 712 can include an impedance sensing circuit that detects the impedance of the lighting circuit 750.

The detector circuit 712 and power circuit 714 can interact by wire and/or wirelessly. The power circuit 714 can send a signal to the detector unit 712 based on which the detector circuit starts (or ends) detecting the response of the lighting circuit 750. For example, the power circuit 714 may send a notification signal to the detector circuit 712 that indicates that the power circuit 714 is about to send an input signal (voltage and/or current signal) to the lighting circuit 750. Based on the notification signal, the detection circuit 712 may begin detecting the response of the lighting circuit 450. Additionally or alternatively, the power circuit 714 may send a notification signal to the detector circuit 712 that indicates that the detection circuit 712 may end detecting the response of the lighting circuit 750.

The detector circuit 712 and the controller 720 can interact by wire and/or wirelessly. For example, the detector circuit 712 may send detector signal to the controller 720 that contains data that represents information related to the detected response (e.g., voltage, current, impedance etc.) of the lighting circuit 750. As described before, the response of the lighting circuit 750 may be represented by an analog signal. In one implementation, the detector circuit 712 includes an analog-to-digital converter (ADC) that can convert the analog response signal to a digital response signal. Converting the analog response signal to the digital response signal may involve sampling the analog response signal at certain times, for example, sampling periodically at a sampling frequency. For example, the analog response signal can be sampled at greater than 1 KHz (more than 1000 samples per second) or at greater than 10 KHz. The sampled analog signal is rounded off to the nearest available digital value (sometimes referred to as "levels") of the ADC. The signal resolution of the ADC may depend on the range of analog signal that the ADC can detect (e.g., range of voltage/current values), and the number of available digital values. For example, the resolution of an 8-bit ADC (256 available digital values), having 5.12V (volts) range (e.g., from 0V to 5.12 V), will be 0.02 volts. This 8-bit ADC may convert a sampled analog signal to the nearest 0.02V-multiple value. For example, a 0.175 V sampled analog signal may be converted to a 0.18 V signal. The time resolution of the ADC (e.g., the time resolution of the digital response signal) depends at the sampling frequency, i.e., the frequency at which the ADC samples the analog response signal. The sampling frequency of the ADC can be set to a value that is greater than twice the maximum frequency of the sampled analog signal (sometimes referred to Nyquist frequency).

In some implementations, the controller 720 can adjust the range of analog signals that the ADC in the detection circuit 712 can detect. The controller 720 can, for example, send a "reference" signal to the ADC that can determine the range of the ADC. For example, referring to the 8-bit ADC example discussed before, the controller 720 may send a 2.56 V reference signal to the ADC. As a result, the range of the 8-bit ADC may change to 2.56V (e.g., from 0V to 2.56 V). Changing the range of an ADC may also change the resolution of the ADC. For example, if the range of an 8-bit ADC is changed from 5.12V to 2.56V by the controller 720, the resolution of the 8-bit ADC may change from 0.02V to 0.01V.

The detector signal (from the detector circuit 712 to the controller 720) can include data that represents information about the digital response signal. The detector signal may also include the sampling times corresponding to the digital response signal. The controller 720 can make a determination about one or more properties of the lighting circuit 750 based on the detector signal for one or more input signals. For example, the controller 720 may compare the detected response signals with response data of known circuits in a database. The known circuits may include lighting circuits with different types of light bulbs (e.g., incandescent, fluorescent, LED, halogen, high intensity discharge, magnetic low-voltage, electronic low-voltage), with different number of light bulbs, or a combination of both. The database may also include one or more input signal data that may be related the response data. For example, the response data, for a known circuit, may represent the response of the known circuit to an input signal (e.g., time-dependent signal) represented by the input data.

The input signal data of a known circuit in the database may represent information about one or more properties of the input signals (voltage and/or current signals). For example, the input signal data can include information about the amplitude and frequency of a sinusoidal input signal. The response data of the known circuit may contain information about one or more properties of the response (e.g., voltage, current, impedance etc.) signal of the known circuit corresponding to an input signal. For example, the response data may comprise an array of numerical values that represents the amplitude of the response signals (e.g., amplitude of voltage and/or current signals) as a function of time.

As described before, the controller 720 can send a control signal to the power circuit 714 that may determine the properties of the input signals (voltage and/or current signals) supplied by the power circuit 714 to lighting circuit 750. In some implementations, the control signal may include input signal data (e.g., the amplitudes and frequencies of the input signals represented by the input signal data). The power circuit 714 may supply input signals to the lighting circuit 750 based on the received input signal data.

The detector circuit 712 may detect the response of the lighting circuit 750 to the aforementioned input signals, and send the detected response signals (e.g., digital response signal from the ADC in the detector circuit 712) to the controller 720. The controller 720 may compare (e.g., by correlation) the detected response signals with the response data. Based on this comparison, the controller 720 may determine one or more properties of the lighting circuit 750.

In one implementation, the power circuit 714 is configured to supply a small current input signal (configured leak electricity) that does not light up the bulbs in the lighting fixtures of the lighting circuit 750. However, the small current input signal may be sufficient to detect a response signal or power draw from the lighting circuit 750. In one implementation, the current input signal can be less than 25 milliamps, less than 15 milliamps, and/or less than 10 milliamps. The power circuit 714 may be configured to increase the power supplied by successive input signals. This can, for example, be achieved by successively increasing the amplitude of the voltage/current input signal In one implementation, the controller 720 is configured to select a diming profile (e.g., forward phase, reverse phase, non-dimmable) of the bulb (whose type has been determined by the controller 720) in the lighting circuit 750. The dimming profiles of the various light bulb may be stored in the database of the controller 720. Based on the diming profile, the controller may send a control signal to the power circuit 714 to change the power supplied to the lighting circuit based on data in the diming profile. The controller 720 may be configured to determine the wattage rating of the bulb in the lighting circuit 750. The wattage can, for example, be determined by the power consumed by the lighting circuit 750. The power consumed by the lighting circuit 750 may be determined by multiplying the detected digital voltage response with the detected digital current response of the lighting circuit 750. Based on the wattage of the lighting circuit 750, the controller may identify the company that manufactures the bulb in the lighting circuit 750.

FIGS. 8A and 8B are schematics of a lighting control module of FIG. 7 with a multi-switch detection system. The lighting control module 700 is depicted separated into a base lighting control module 812 and a switch module or switch controller 802. As described herein, the switch module 802 may include a tactile interface and a switch actuator, such as the tactile display 104 and the light switch actuator 106 described herein. The switch module 802 can also house the controller 720. The power circuit 714 may include a transformer 818, a power isolator and DC converter 814, and a dimmer, such as a TRIAC dimmer 813. In some embodiments, the power circuit 714 may include a MOSFET dimmer. The detection circuit 712 may include a voltage and current sensor 816. FIG. 8A shows the lighting control module 700 with a distinct voltage/current sensor(s) 816 than that of FIG. 8B. FIG. 8A shows light control module 700 that is compatible (i.e. configured to be communicably and/or operationally coupled) with a corresponding light control module 700, but is also compatible with a another 3$^{rd}$ party switch, for example a switch without any current sensing, data, and/or digital transmission capabilities. The power isolator separates the analog AC current from the low power or DC digital components in the base lighting control module 812 and the switch module 802.

Figure 8:
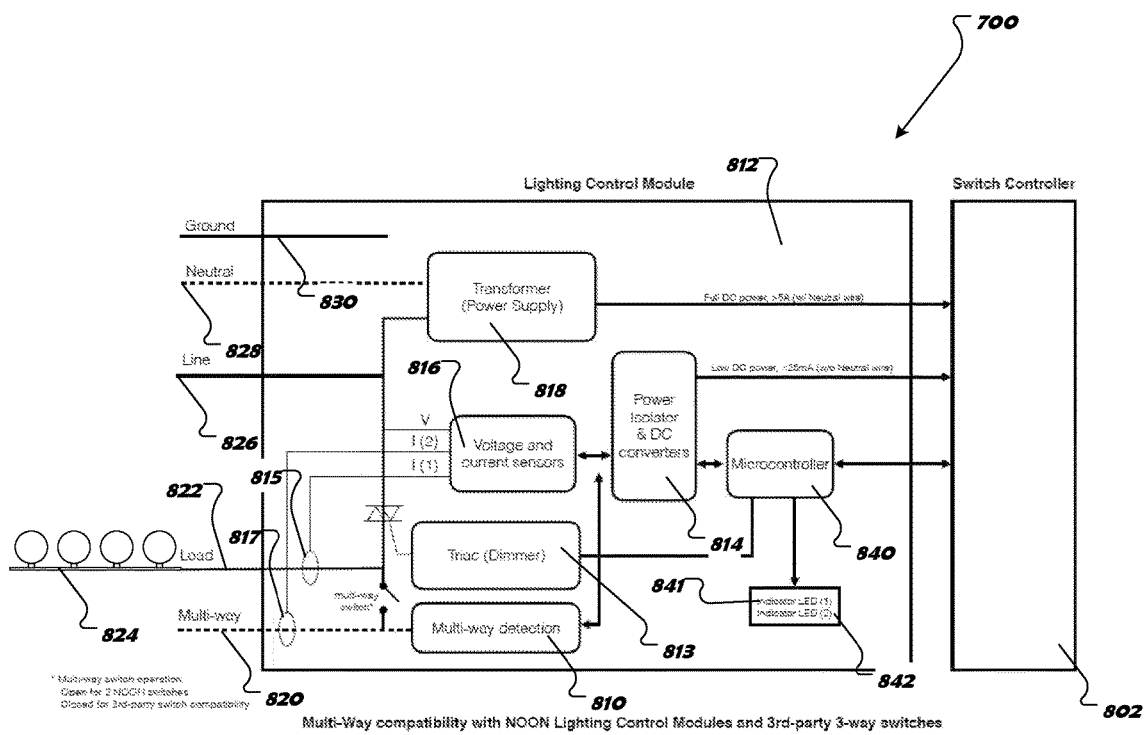
FIG. 8 is schematics of a lighting control module of FIG. 7 with a multi-switch detection system.

The base lighting control module 812 includes a ground terminal 830 for grounding various electrical components container in the module 812. The base light control module 812 includes a neutral terminal 828 for connecting to a neutral wire, a line terminal 826, and a load terminal 822. As shown in FIG. 8, the voltage and current sensor(s) are coupled to the load line to detect changes in the voltage or current along the line carrying power to one or more light fixtures 824 connected to the lighting circuit (750). The base lighting control module 812 also includes a controller 840 communicably coupled to the controller 720. The base lighting control module 812 also includes LED indicator lights 842 and 841 for indicating information regarding the status of the base lighting control module 812. For example, in some embodiments LED indicator light 841 can indicates if a neutral wire is connected while LED indicator light 842 can indicate if a 3-way connection is connected.

Figure 9A:
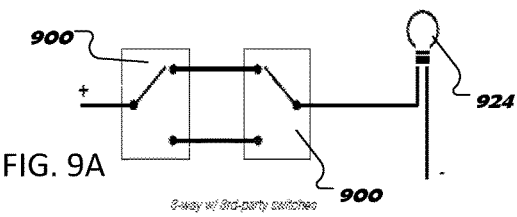
FIGS. 9A-9D show multi-switch wiring configuration for connecting distinct switch types.
Figure 9B:
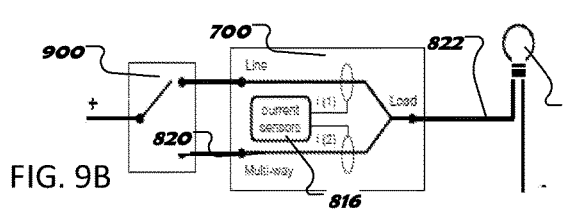
Figure 9D:
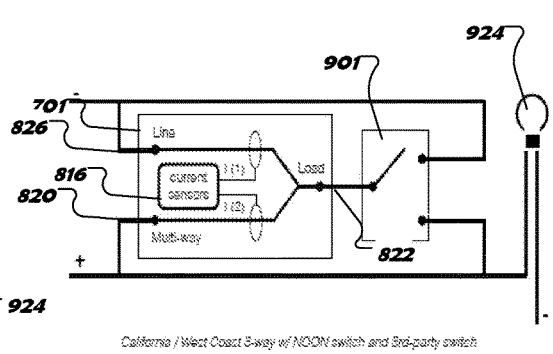
Figure 9C:
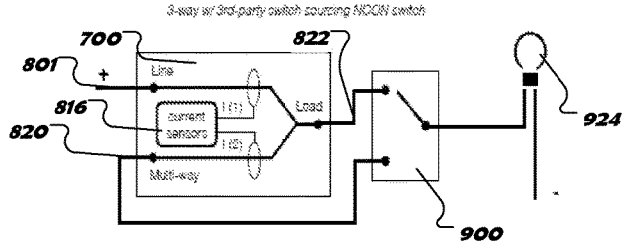

FIGS. 9A-9D show multi-switch wiring configuration for connecting distinct switch types. FIG. 9A shows two 3-way switches 900 connected to one another and a light bulb of a light fixture 924. If one of those switches is connected incorrectly to a lighting control module 700 incorrectly, there is a risk that the switch 900 will prevent the lighting control module from proper operation or prevent it from operating at all. FIG. 9B shows how a 3-way switch 900 can be coupled to a lighting control module 700 if the switch 900 is positioned upstream of the lighting control module 700 with respect to a power source. If a lighting control module 700 is connected to a 3-way switch 900 downstream of the switch 900, the current sensor(s) is connected to both line 801 and the multi-way line are traveler line 820. The current sensor 816 is configured to activate an inverse protocol in response to receipt of current on either line 801 or line 820. The inverse switching protocol causes the lighting control module 700 to inverse an input received from the switch 900 at either the common terminal or the traveler terminal. Accordingly, every time the lighting control module 700 recognizes that a change has occurred via the switch 900 it reverses the logic. The third party switch 900 is thereby never opening or closing the flow to the light fixture 924 directly. FIG. 9C shows how a 3-way switch 900 can be coupled to a lighting control module 700 if the switch 900 is positioned downstream of the lighting control module 700 with respect to a power source. In such a case the lighting control module 700 still executes an inverse protocol in response to detected changes. However, now the lighting control module 700 switches the path of its own inputs to the switch 900 in response to a user changing the position of the switch 900. For example, if the user switches the 3rd party switch from the position illustrated in FIG. 9C the current sensor detects the change and causes inputs to be transmitted to the switch 900 via the multi-way line 820 instead of load line 822. Since the lighting control module 700 always has power flowing through it there is always a current that is being detected. FIG. 9D illustrates a configuration where the lighting control module 700 is connected in a California 3-way configuration.

Figure 10:
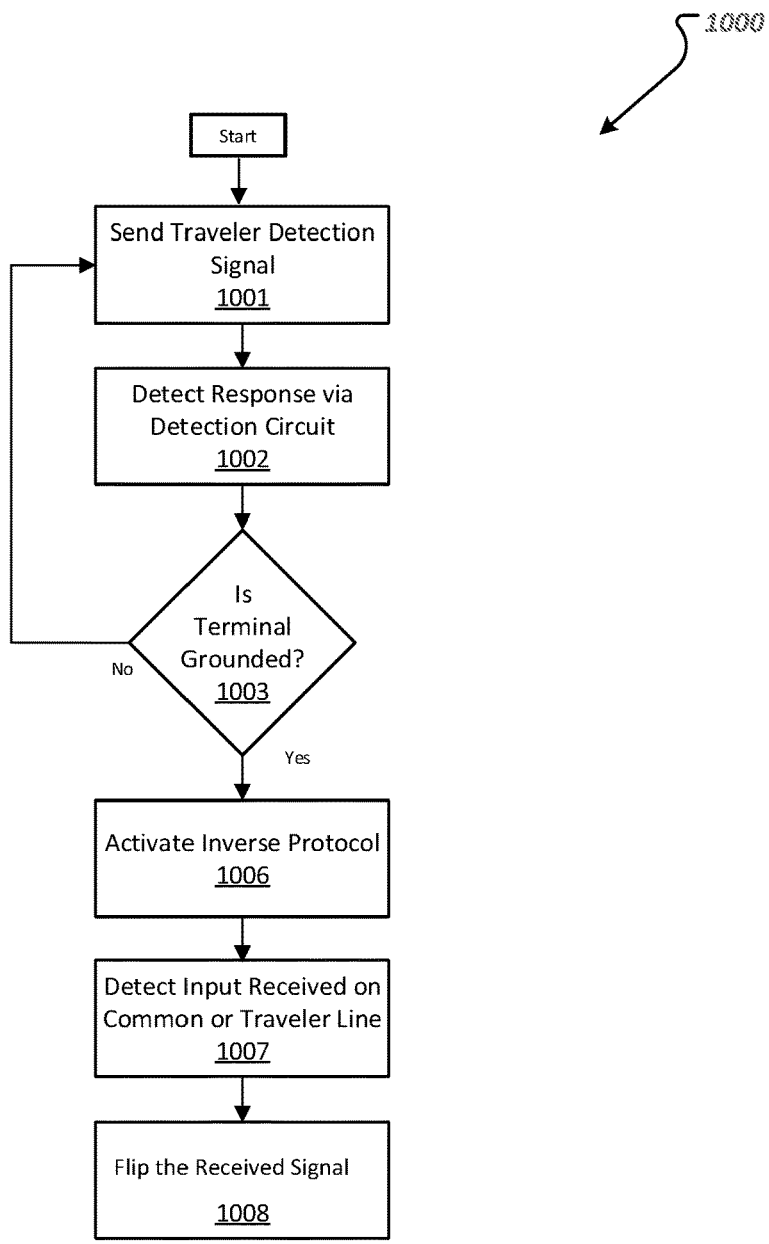
FIG. 10 is a flow diagram of a system for adjusting an operating protocol of a lighting control module configured for multi-switch operation.

FIG. 10 is a flow diagram of a system 1000 for adjusting an operating protocol of a lighting control module configured for multi-switch operation. At 1001 a traveler detection signal is transmitted. At 1002 a response to the detection signal is detected, for example via the detection circuit, which can include the multi-way detection circuit 810. At 1003 a determination is made as to whether or not the traveler terminal is grounded. If the terminal is not grounded the signal may be retransmitted or the call ended. If the traveler terminal is determined to be grounded at 1003, the switch activates an inverse action protocol at 1006. At 1007, the inverse action protocol detects a change by current flow on either the traveler wire or the common line. At 1008, the lighting control module flips the signal received to the other of the traveler wire or the common line which did not receive the signal.

Figure 11:
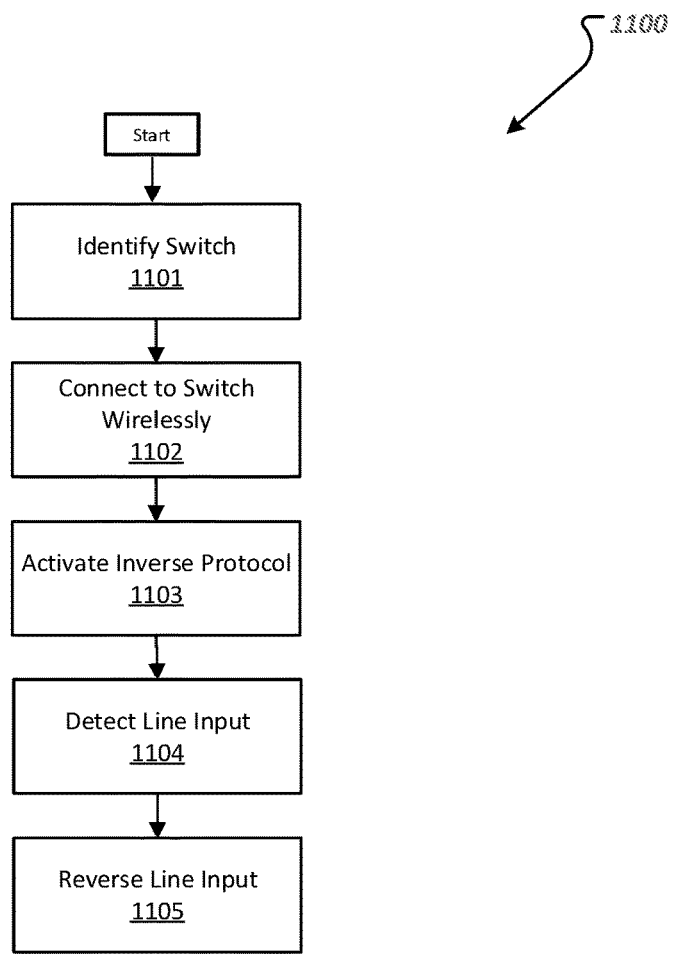
FIG. 11 is a flow diagram of a system for remotely adjusting an operating protocol of a lighting control module configured for multi-switch operation.

FIG. 11 is a flow diagram of a system for remotely adjusting an operating protocol of a lighting control module configured for multi-switch operation. In particular, system 1100 can be operated to activate an inverse switch protocol manually from a remote computing device. At 1101, the remote computing device identifies the switch up which the inverse protocol should be initiated. At 1102, the remote computing device wirelessly connects to lighting control module 700. At 1103, the inverse protocol on the lighting control module 700 is activated. At 1104, a change in current on a line of the lighting control module 700 is detected. At 1105 the input received by way of the detected current change is reversed.

Implementations of the subject matter and the operations described in this specification can be implemented by digital electronic circuitry, or via computer software, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Implementations of the subject matter described in this specification can be implemented in a computing system that includes a back end component, e.g., as a data server, or that includes a middleware component, e.g., an application server, or that includes a front end component, e.g., a user computer having a graphical display or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some implementations, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

For the purpose of this disclosure, the term "coupled" means the joining of two members directly or indirectly to one another. Such joining may be stationary or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It should be noted that the orientation of various elements may differ according to other exemplary implementations, and that such variations are intended to be encompassed by the present disclosure. It is recognized that features of the disclosed implementations can be incorporated into other disclosed implementations.

While various inventive implementations have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive implementations described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive implementations described herein. It is, therefore, to be understood that the foregoing implementations are presented by way of example only and that, within the scope of the appended claims and equivalents thereto, inventive implementations may be practiced otherwise than as specifically described and claimed. Inventive implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, implementations may be constructed in which acts are performed in an order different than illustrated, which may include performing some acts simultaneously, even though shown as sequential acts in illustrative implementations.

The claims should not be read as limited to the described order or elements unless stated to that effect. It should be understood that various changes in form and detail may be made by one of ordinary skill in the art without departing from the spirit and scope of the appended claims. All implementations that come within the spirit and scope of the following claims and equivalents thereto are claimed.

The invention claimed is:

1. A lighting control system multi-switch apparatus, the apparatus comprising:
   a lighting control module including at least three electrical terminals, including a power terminal, a common terminal, and a traveler terminal, the lighting control module configured to cause a transmission of a quantity of electrical energy to a lighting circuit of a light fixture electrically connected to the lighting control module;
   a detector circuit positioned in the lighting control module, the detector circuit electrically coupled to the traveler terminal and configured to detect a grounding of the traveler terminal; and
   a controller system in electrical communication with the detector circuit, the controller system configured to cause a call signal to be transmitted to a switch connected to the traveler terminal, the call signal configured to request the switch connected to the traveler terminal transmit a response signal to the controller system to identify the switch connected to the traveler terminal, wherein the controller system is configured to initiate an inverse switching protocol in response to a failure of the switch connected to the traveler terminal to respond, the inverse switching protocol configured to cause the lighting control module to inverse an input received from the switch at either the common terminal or the traveler terminal.

2. The apparatus according to claim 1, wherein the detector circuit includes a current sensor.

3. The apparatus according to claim 2, wherein the current sensor is coupled to at least two of the three electrical terminals.

4. The apparatus according to claim 1, wherein the controller system is configured to cause the call signal to be transmitted through the traveler terminal.

5. The apparatus according to claim 1, wherein the call signal has an electrical current of less than 1 amp.

6. The apparatus according to claim 1, wherein the switch connected to the traveler terminal is downstream of the lighting control module with respect to a power source connected to the lighting control module upstream of the lighting control module.

7. The apparatus according to claim 1, wherein the switch connected to the traveler terminal is upstream of the lighting control module with respect to a power source coupled to the switch upstream of the switch.

8. The apparatus according to claim 1, wherein the detector circuit includes an analog digital converter.

9. The apparatus according to claim 1, wherein the controller system is configured to cause the call signal to be transmitted to the switch connected to the traveler terminal by being connected to a memory storage device.

10. A lighting control system multi-switch apparatus, the apparatus comprising:
   a lighting control module including at least three electrical terminals, including a power terminal, a common terminal, and a traveler terminal, the lighting control module configured to cause a transmission of a quantity of electrical energy to a lighting circuit of a light fixture electrically connected to the lighting control module;
   a detector circuit positioned in the lighting control module, the detector circuit electrically coupled to the traveler terminal and configured to detect a grounding of the traveler terminal; and
   a controller system in electrical communication with the detector circuit, the controller system configured to initiate an inverse switching protocol in response to a detection by the detector circuit of the grounding of the traveler terminal, the inverse switching protocol configured to cause the lighting control module to inverse an input received at either the common terminal or the traveler terminal from a switch connected to the traveler terminal.

11. The apparatus according to claim 10, wherein the controller system is configured to initiate the inverse switching protocol in response to the detection by the detector circuit of the grounding of the traveler terminal by being connected to a memory storage device.

* * * * *